United States Patent
Lushington

(10) Patent No.: US 9,261,787 B1
(45) Date of Patent: *Feb. 16, 2016

(54) CONDUCTIVE ELEMENT PRECURSOR AND CONDUCTIVE PATTERN FORMATION

(71) Applicant: Eastman Kodak Company, Rochester, NY (US)

(72) Inventor: Kenneth James Lushington, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/468,626

(22) Filed: Aug. 26, 2014

(51) Int. Cl.
*H05K 1/09* (2006.01)
*G03F 7/06* (2006.01)
*G03C 1/06* (2006.01)
*G03C 1/825* (2006.01)
*G03C 1/815* (2006.01)

(52) U.S. Cl.
CPC .. *G03F 7/06* (2013.01); *G03C 1/06* (2013.01); *G03C 1/815* (2013.01); *G03C 1/825* (2013.01)

(58) Field of Classification Search
CPC .......... G03C 1/06; G03C 1/815; G03C 1/825; G03F 7/06
USPC .............. 430/264, 495.1, 496, 510, 512, 600, 430/613, 567, 931; 174/257
See application file for complete search history.

(56) References Cited

U.S. PATENT DOCUMENTS

| | | |
|---|---|---|
| 3,464,822 A | 9/1969 | Blake |
| 4,803,150 A | 2/1989 | Dickerson et al. |
| 7,943,291 B2 | 5/2011 | Tokunaga et al. |
| 8,012,676 B2 | 9/2011 | Yoshiki et al. |
| 2011/0289771 A1 | 12/2011 | Kuriki |
| 2011/0308846 A1 | 12/2011 | Ichiki |
| 2015/0216043 A1* | 7/2015 | Lushington .............. G03C 5/29 |

* cited by examiner

*Primary Examiner* — Geraldina Visconti
(74) *Attorney, Agent, or Firm* — J. Lanny Tucker

(57) ABSTRACT

Black-and-white silver halide conductive film element precursors have, on one or both sides and in order, a UV filter layer, non-color hydrophilic photosensitive layer comprising a silver halide, and a hydrophilic overcoat as an outer layer. The one or two UV filter layers individually contains one or more UV absorbing agents in an amount of up 0.5 mmol/$m^2$ and the total amount in the precursor is up to 1 mmol/$m^2$ to prevent crosstalk during imagewise exposure. These precursors can be imagewise exposed and processed to provide conductive film elements with various conductive silver patterns (or grids) with narrow conductive silver lines on one or both sides. Such conductive film elements can be prepared with reduced yellowness as evidenced by reduced b* values. The resulting conductive film elements are highly transparent and can be used in various devices such as display devices.

19 Claims, No Drawings

CONDUCTIVE ELEMENT PRECURSOR AND CONDUCTIVE PATTERN FORMATION

RELATED APPLICATIONS

Reference is made to the following copending and commonly assigned patent applications, the disclosures of all of which are incorporated herein by reference:

U.S. Ser. No. 13/771,549 filed Feb. 20, 2013 by Sanger and Scaglione;

U.S. Ser. No. 13/919,203 filed Jun. 17, 2013 by Gogle, Lowe, O'Toole, and Youngblood;

U.S. Ser. No. 14/166,910 filed by myself on Jan. 29, 2014; and

U.S. Ser. No. 14/265,418 filed May 20, 2014 by Lushington.

FIELD OF THE INVENTION

This invention relates to flexible and transparent black-and-white conductive element precursors having a UV filter layer between a transparent substrate and overlying photosensitive layer. Such precursors can be imagewise exposed and processed to provide conductive metal patterns on one or both sides of a transparent substrate.

BACKGROUND OF THE INVENTION

Rapid advances are occurring in various electronic devices especially display devices that are used for various communicational, financial, and archival purposes. For such uses as touch screen panels, electrochromic devices, light emitting diodes, field effect transistors, and liquid crystal displays, conductive films are essential and considerable efforts are being made in the industry to improve the properties of those conductive films.

There is a particular need to provide touch screen displays and devices that contain improved conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. These smaller segments require additional driving and sensing electronics. In addition ITO is a ceramic material, is not readily bent or flexed, and requires vacuum deposition with high processing temperatures to prepare the conductive layers.

Silver is an ideal conductor having conductivity 50 to 100 times greater than ITO. Unlike most metal oxides, silver oxide is still reasonably conductive and this reduces the problem of making reliable electrical connections. Silver is used in many commercial applications and is available from numerous sources. It is highly desirable to make conductive film elements using silver as the source of conductivity, but it requires considerable development to obtain the optimal properties.

U.S. Patent Application Publication 2011/0308846 (Ichiki) describes the preparation of conductive films formed by reducing a silver halide image in conductive networks with silver wire sizes less than 10 µm, which conductive films can be used to form touch panels in displays.

In addition, U.S. Pat. No. 3,464,822 (Blake) describes the use of a silver halide emulsion in a photographic element to form a conductive silver surface image by development and one or more treatment baths after development.

Improvements have been proposed for providing conductive patterns using photosensitive silver salt compositions such as silver halide emulsions as described for example in U.S. Pat. No. 8,012,676 (Yoshiki et al.).

U.S. Pat. No. 7,943,291 (Tokunaga et al.) describes photosensitive materials that can be used to prepare conductive silver-containing films.

U.S. Ser. No. 14/265,418 described above provided an improvement in this technology with duplex silver halide conductive film element precursors containing an immobilized UV radiation absorber in the outermost hydrophilic overcoat. Such duplex precursors are used to provide unique conductive silver images on each side of the transparent substrate. However, to reduce "crosstalk" from one photosensitive side to the other photosensitive during imagewise exposure from both sides, these silver halide conductive film element precursors included about 300 mg/m$^2$ (0.9 mmol/m$^2$) of UV absorbing agents in filter layers on both sides of the transparent substrate.

While the crosstalk can be reduced in such manner when the amount of UV absorbing agents is high enough, there is a danger that the chosen UV absorbing agent has a broad enough absorption that it also absorbs in the "blue" region of the electromagnetic spectrum (for example greater than 400 nm). When this occurs, the resulting precursor exhibits undesirable yellow coloration.

There is a need to both reduce crosstalk during imagewise exposure using UV absorbing agents such as in UV filter layers without causing unwanted yellowness in the precursor.

SUMMARY OF THE INVENTION

The present invention provides a black-and-white silver halide conductive film element precursor comprising a transparent substrate comprising a first supporting side and an opposing second supporting side, and having disposed on the first supporting side:

a first UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a first non-color hydrophilic photosensitive layer comprising a silver halide coverage of at least 3,500 mg Ag/m$^2$, and a first hydrophilic overcoat disposed over the first non-color hydrophilic photosensitive layer, which first hydrophilic overcoat is the outermost layer on the first supporting side of the transparent substrate, and the first hydrophilic overcoat comprises a hydrophilic binder or colloid, and the first hydrophilic overcoat optionally comprises: (a) one or more immobilized radiation absorbers in a total amount of at least 5 mg/m$^2$, (b) one or more silver halides in a total amount of at least 5 mg Ag/m$^2$, or both (a) and (b), the black-and-white silver halide conductive film element precursor optionally comprising on the opposing second supporting side:

a second UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a second non-color hydrophilic photosensitive layer comprising a silver halide coverage of at least 3,500 mg Ag/m$^2$, and a second hydrophilic overcoat disposed over the second non-color hydrophilic photosensitive layer, which second hydrophilic overcoat is the outermost layer on the opposing second supporting side of the transparent substrate, and the second hydrophilic overcoat comprises a hydrophilic binder or colloid, and the second hydrophilic overcoat optionally comprises: (a) one or more immobilized radiation absorbers in a total amount of at least 5 mg/m$^2$, (b) one or more silver halides in a total amount of at least 5 mg Ag/m$^2$, or both (a) and (b), wherein the total amount of the one or more UV absorbing agents in the first UV filter layer and the second UV filter layer, when present, is no more than 1 mmol/m$^2$.

This invention can also provides a method for preparing a conductive film element comprising:

providing the black-and-white silver halide conductive element film precursor of claim 1, imagewise exposing the black-and-white silver halide conductive film element precursor to provide a latent silver halide pattern in the first non-color hydrophilic photosensitive layer, converting the latent silver halide pattern to an electrically-conductive silver metal pattern by contacting the latent silver halide pattern with a developing solution comprising a silver halide developing agent, removing any unconverted silver halide from the first non-color hydrophilic photosensitive layer, leaving the electrically-conductive silver metal pattern corresponding to the silver halide latent pattern, and optionally further treating the electrically-conductive silver metal pattern to enhance its conductivity.

A conductive film elements provided by this invention can comprise:

a transparent substrate that is optionally flexible, and the conductive film element comprises a first supporting side and an opposing second supporting side, and comprises on the first supporting side:

a first UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a first non-color hydrophilic layer comprising an electrically-conductive silver metal pattern, and the conductive film element having an integrated transmittance of at least 80% in the conductive silver pattern, and a first hydrophilic overcoat disposed over the first non-color hydrophilic layer, which first hydrophilic overcoat is the outermost layer on the first supporting side of the transparent substrate, and the first hydrophilic overcoat comprises a hydrophilic binder or colloid, and the first hydrophilic overcoat optionally comprises one or more immobilized radiation absorbers in a total amount of at least 5 mg/m$^2$, and the conductive film element optionally comprising on the opposing second supporting side:

a second UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a second non-color hydrophilic layer comprising an electrically-conductive silver metal pattern, and the conductive film element having an integrated transmittance of at least 80% in the conductive silver pattern, and a second hydrophilic overcoat disposed over the second non-color hydrophilic layer, which first hydrophilic overcoat is the outermost layer on the second supporting side of the transparent substrate, and the second hydrophilic overcoat comprises a hydrophilic binder or colloid, and the second hydrophilic overcoat optionally comprises one or more immobilized radiation absorbers in a total amount of at least 5 mg/m$^2$, wherein the total amount of the one or more UV absorbing agents in the first UV filter layer and the second UV filter layer, when present, is no more than 1 mmol/m$^2$.

The present invention provides conductive film elements that can be incorporated into display devices such as touch screens to provide various advantages. The black-and-white silver halide conductive film element precursors used to make these conductive film elements are provided with one or more ultraviolet radiation (UV) filter layers, each of which is disposed between the transparent substrate and the non-color hydrophilic photosensitive layer. Each UV filter layer contains one or more UV absorbing agents, and the total amount of such compounds in each precursor, on one or both sides, is sufficient to reduce "crosstalk" so that imaging radiation impinging on one side of the transparent substrate does not adversely affect any photosensitive materials on the opposing side of the transparent substrate.

Moreover, the total amount of UV absorbing agents in the UV filter layer(s) of the precursor of this invention is chosen, depending upon the extinction coefficient of the particular UV absorbing agents used, to minimize overall yellowness in the resulting conductive film elements as well as to minimize "crosstalk" as discussed below.

For example, it would be desirable for a conductive film element of this invention with specific composition and layer structure, to keep the overall b* (after imaging and processing) to 0.7 or less. While it is understood that all of the materials in a conductive film element contributes to the overall b* value, we have found in the practice of this invention that the overall b* can be reduced by reducing the contribution to b* from UV absorbing agents in one or both UV filter layers. We have found that a certain amount of the UV absorbing agents according to this invention will provide reduced overall b* compared to previously designed conductive film elements. In some embodiments, it is desirable to use UV absorbing agents in amounts that contribute less than 0.25 of an overall b* value for the resulting conductive film element.

While the previously used higher amounts of UV absorbing agents will readily reduce or even eliminate "crosstalk", such higher amounts undesirably increase overall b* (that is, yellowness) in the resulting conductive film elements. It is an unexpected advantage of the present invention that both the overall yellowness (b*) and "crosstalk" problems can be addressed simultaneously in a satisfactory and cost-effective manner.

DETAILED DESCRIPTION OF THE INVENTION

The following discussion is directed to various embodiments of the present invention and while some embodiments can be preferred for specific uses, the disclosed embodiments should not be interpreted or otherwise considered to be limiting the scope of the present invention, as claimed below. In addition, one skilled in the art will understand that the following disclosure has broader application than is explicitly described and the discussion of any embodiment.

Definitions

As used herein to define various components of the various layers or formulations used to form layers and processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, solution, or the % of the dry weight of a layer. Unless otherwise indicated, the percentages can be the same for either a dry layer or pattern, or for the total solids of the formulation or composition used to make that layer or pattern.

A "black-and-white silver halide conductive film element precursor" (or "precursor") is meant herein to refer to an article or element of this invention that can be used to provide the conductive film element (or "conductive article") of the present invention. Such precursors therefore comprise a photosensitive precursor to the silver metal nuclei (particles), such as a silver halide as described below that is suitably converted (for example by reduction) to silver metal. Much of the discussion about the precursors is equally applicable to the conductive film elements as most of the components and structure or the ultraviolet radiation (UV) filter layers are not changed when silver cations in a silver halide are converted to silver metal nuclei. Thus, unless otherwise indicated, the discussion of transparent substrates, hydrophilic binders and colloids, UV absorbing agents, and other addenda in non-color hydrophilic photosensitive layers, UV filter layers, and hydrophilic overcoats for the precursors are also intended to describe the components and structure of the resulting conductive film elements.

Unless otherwise indicated, the terms "conductive film element" and "conductive article" are intended to mean the same thing.

The term "first" refers to the layers on one supporting side of a transparent substrate and the term "second" refers to the layers on the opposing (opposite) second supporting side of the transparent substrate. Each supporting side of the transparent substrate can be equally useful and the term "first" does not necessarily mean that such side is the primary or better supporting side of the support.

The term "duplex" is used herein in reference to black-and-white silver halide conductive film element precursors and conductive film elements having the described layers on both supporting sides of the transparent substrate. Unless otherwise indicated herein, the relationships and compositions of the various layers can be the same or different on both supporting sides of the transparent substrate. But in all cases, such duplex articles are intended to have silver metal patterns on both sides of the transparent substrate.

ESD refers to "equivalent spherical diameter" and is a term used in the photographic art to define the size of particles such as silver halide grains. Particle size of silver halide grains as expressed in grain ESD can be readily determined using disc centrifuge instrumentation.

The "immobilized radiation absorbers" that can be used in some embodiments of the present invention refer to compounds that absorb at a predetermined spectral absorption wavelength ($\lambda_{max}$) or range of wavelengths within the general range of at least 200 nm and up to and including 700 nm. Particularly useful immobilized radiation absorbers include immobilized ultraviolet radiation (UV) absorbing agents that can absorb in the general range of at least 200 nm and up to and including 390 nm (or more likely at least 300 nm and up to and including 390 nm). The immobilized radiation absorbers do not readily migrate out of the hydrophilic overcoat (or in the UV filter layer for some UV absorbing agents) in which they are incorporated. This means that each of the immobilized radiation absorbers has a c(log P) value of at least 5 and more likely at least 6 in order to provide sufficient diffusion resistance in the hydrophilic overcoat. The parameter "c(log P)" refers to the logarithmic octanol-water partition coefficient that is a physical property used to describe a compound's lipophilic or hydrophobic properties. It is the ratio of the compound's concentration in the octanol phase to its concentration in the aqueous phase of a two-phase system at equilibrium. Since measured values range from less than $10^{-4}$ to greater than $10^{+8}$ (at least 12 orders of magnitude), the logarithm (log P) is commonly used to characterize this value. Known software programs can be used to determine this value for a given ultraviolet radiation absorber. One program methodology used to determine c(log P) values is described by Meylan et al. in *Pharm. Sci.* 84:83-92 (1995). The c(log P) values can also be calculated using a computer program provided by SRC Inc. (formerly Syracuse Research Corporation), which computer program and methodology can be identified as the "SRC method".

The UV absorbing agents used in the UV filter layers can be the same or different from the immobilized radiation absorbers used in the hydrophilic overcoats. Some of the UV absorbing agents in the UV filter layers can be "immobilized" as defined herein while others are not.

"Crosstalk" refers to the effect of exposing radiation that impinges on one side of a precursor, traveling through a transparent substrate, reaching the opposite side of the precursor in sufficient intensity to create an unwanted developable latent silver halide image in any black-and-white photosensitive layer on the opposite side of the precursor.

Integrated transmittance can be determined using a known spectrophotometer and procedures designed for its use.

The CIELAB b* values described herein can be obtained using the apparatus and methods described below in the Examples.

Uses

The precursors of this invention can be used in many ways to form conductive film elements comprising an electrically-conductive silver metal pattern on one or both supporting sides of a suitable transparent substrate. These conductive film elements can be used as devices themselves or they can be used as components in display or computing devices having a variety of applications including but not limited to, electronic, optical, sensory, and diagnostic uses. In particular, it is desired to use the precursors of the present invention to provide conductive film elements with highly electrically-conductive silver metal patterns comprising lines having a line resolution (line width) of less than 50 µm, or less than 15 µm, or even less than 10 µm and as low as 1 µm.

Such electronic and optical devices and components include but are not limited to, radio frequency tags (RFID), sensors, touch screen displays, and memory and back panel displays.

Touch screen technology can comprise different touch sensor configurations including capacitive and resistive touch sensors. Resistive touch sensors comprise several layers that face each other with a gap between adjacent layers that can be preserved by spacers formed during manufacturing. A resistive touch screen panel can comprise several layers including two thin, metallic, electrically conductive layers separated by a gap that can be created by spacers. When an object such as a stylus, palm, or fingertip presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically-conductive features can be created in a single pass are possible using the present invention. The precursors can be used in such systems and methods to form multiple high resolution conductive images from predetermined designs of patterns from exposure through multiple masking elements. Multiple patterns can be printed on one or both sides of a transparent substrate as described in more details below. For example, one predetermined electrically-conductive pattern can be printed on one supporting side of the transparent substrate and a different predetermined electrically-conductive pattern can be printed on the opposing second supporting side of the transparent substrate.

Black-and-White Silver Halide Conductive Film Element Precursors

The precursors of this invention are photosensitive but do not contain chemistry to provide color photographic images. Thus, these precursors are considered to be black-and-white photosensitive materials and significantly non-color image-forming.

In most embodiments, the precursors and the resulting conductive film elements, including the transparent substrate and all accompanying layers on one or both supporting sides, are considered transparent meaning that the integrated transmittance in the entire visible region of the electromagnetic spectrum (for example from 400 nm to 750 nm) through the entire element is 75% or more, or more likely at least 90% or even 95% or more, as determined using a spectrophotometer and known procedures.

Precursors having the same or different essential layers on both supporting sides of the transparent substrate can be known as "duplex", "double-coated", or "two-sided" precursors.

Each precursor is formed at least by providing a first non-color (that is, black-and-white) hydrophilic photosensitive layer on at least one supporting or planar side (as opposed to non-supporting edges) of a suitable transparent substrate in a suitable manner. This first non-color hydrophilic photosensitive layer comprises a silver halide, or a mixture of silver halides, at a total silver coverage of at least 3500 mg $Ag/m^2$ and up to and including 8,000 mg $Ag/m^2$ and in some embodiments, less than 5000 mg $Ag/m^2$, for example up to and including 4900 mg $Ag/m^2$. This non-color hydrophilic photosensitive layer has sufficient silver halide and sensitization to be photosensitive to selected (predetermined) imaging irradiation (described below).

Such precursors are therefore treated in such a manner as to convert the silver cations (such as by reduction) into silver metal particles (nuclei), and then appropriately "processed" as described below. In most embodiments, the precursors of this invention consist essentially of the three following essential layers on one or both supporting sides of the transparent substrate, in order from the transparent substrate: a UV (ultraviolet) filter layer generally disposed (usually, directly with no intervening layers) on the transparent substrate, a non-color hydrophilic photosensitive layer generally disposed (usually, directly with no intervening layers) on the UV filter layer, and a hydrophilic overcoat generally disposed (usually, directly with no intervening layers) on the non-color hydrophilic photosensitive layer. These three essential layers can be disposed on only one supporting side of the transparent substrate, or they can be disposed in the same order on both first supporting and opposing second supporting sides of the transparent substrate to form a duplex precursor. Optional layers can also be present on either or both supporting sides and are described below but they are not essential to achieve the desired advantages of the present invention and in most embodiments, such optional layers are omitted.

Transparent Substrates:

The essential layers and any optional layers are disposed in a suitable manner on one or both supporting sides (planar surfaces) of a transparent substrate. The choice of transparent substrate generally depends upon the intended utility of the resulting conductive film element, and can be any transparent substrate on which a conductive silver film, conductive silver grid, or conductive wiring pattern can be suitable formed with desired transmittance. The transparent substrate can be rigid or flexible and generally has an integrated transmittance of at least 75% and generally at least 90%. Suitable transparent substrates include transparent materials such as glass, glass-reinforced epoxy laminates, and films composed of cellulose triacetate and other cellulose acetates, acrylic esters, polycarbonates, adhesive-coated polymers, polyesters, and composite materials. For example, suitable polymers for use as polymer film substrates include but are not limited to, polyesters such as polyethylene terephthalate (PET) and polyethylene naphthalate (PEN), poly-1,4-cyclohexanedimethylene terephthalate, poly(butylene terephthalate), and copolymers thereof, polypropylenes, polyvinyl acetates, polyurethanes, polyamides, polyimides, polysulfones, cellulose derivatives such as a cellulose ester, cellulose triacetate, cellulose diacetate, cellulose acetate propionate, cellulose acetate butyrate, polycarbonates, polystyrene, polyolefins such as polyethylene or polypropylene, polysulfones, polyacrylates, polyether imides, and mixtures thereof. Flexible and transparent polymeric substrates can also comprise two or more layers of the same or different or polymeric composition so that the composite transparent substrate (or laminate) has the same or different layer refractive properties.

The transparent substrate can be treated on either or both supporting sides to improve adhesion of the first applied layer as a formulation or dispersion. For example, the transparent substrate can be coated with a polymer latex adhesive layer or one or both supporting sides can be chemically treated or subjected to a corona treatment. Various polymeric films used for transparent substrates can also be heat treated (heat-relaxed) or stretched (uniaxial or biaxial), or both heat treated and stretched as is commonly done in the art for photographic film base.

The substrates are transparent to facilitate transmittance of the entire material to provide integrated transmittance of at least 90% in the UV and visible region of the electromagnetic spectrum (for example at least 200 nm and up to and including 750 nm).

Biaxially oriented film sheets used as transparent substrates can also be provided with additional layers that can serve to change the optical, adhesive, or conductive properties of the film sheet. Such layers might contain tints, antistatic or conductive materials, or slip agents.

Particularly useful transparent substrates for the manufacture of flexible electronic devices or touch screen components are used to facilitate rapid roll-to-roll application. Estar® poly(ethylene terephthalate) films and cellulose triacetate films are particularly useful materials for making flexible transparent substrates for use in the present invention. Such films can be biaxially stretched and heat treated as is known in the art.

The transparent substrate can be the same as a support or film that is already incorporated into a flexible display device, by which it is meant that essential layers described herein are applied to a transparent substrate material within a display device and imaged in situ according to a desired pattern, and then processed in situ.

Where a discrete transparent substrate is utilized (that is, the transparent substrate is not already incorporated in a flexible display device), the three essential layers (from formulations) and optional layers are applied to one or both supporting sides thereof using known application or coating techniques and equipment.

The transparent substrate used in the conductive film element precursor can have a thickness of at least 20 μm and up to and including 300 μm or typically at least 75 μm and up to and including 200 μm. Antioxidants, brightening agents, antistatic or conductive agents, plasticizers, and other known additives can be incorporated into the transparent substrate, if desired, in amounts that would be readily apparent to one skilled in the art.

UV (Ultraviolet Radiation) Filter Layers:

These layers comprise one or more ultraviolet (UV) absorbing agents dispersed within one or more hydrophilic binders or colloids, such as those described below for the non-color hydrophilic photosensitive layers. A gelatin or gelatin derivative is particularly useful as the hydrophilic binder(s). Such hydrophilic binders or colloids are present in the first UV filter layer (and second UV filter layer if present) in an amount of at least 70 weight % and up to and including 99 weight %, based on the total dry weight of the UV filter layer. The dry thickness of each UV filter layer is generally at least 0.2 μm and up to and including 2.5 μm.

The one or more UV absorbing agents are generally present, independently (same or different compounds and amounts), in each UV filter layer on one or both supporting sides of the transparent substrate in a total amount of at least 0.01 mmol/m² and up to and including 0.5 mmol/m², or in an amount of at least each 0.1 mmol/m² and up to and including 0.4 mmol/m². These total amounts refer to each UV filter layer.

However, in addition, each precursor of this invention should comprise at least 0.02 mmol/m² and up to and including 1 mmol/m² of all UV absorbing agents represented in one or both UV filter layers. All of this total amount can be on a single supporting side of the transparent substrate, but in most embodiments, the precursor is a "duplex" precursor and has at least some of the total amount in a UV filter layer on each supporting side of the transparent substrate. Whether the precursor is a duplex precursor or not, the total amount of all UV absorbing agents in the UV filter layer(s) can be up to and including 0.8 mmol/m². In the duplex precursors of this invention, the total amount of all UV absorbing agents can be up to and including 0.7 mmol/m². In some of these embodiments, the amounts of UV absorber agent(s) in the first and second UV filter layers are essentially the same (varying by no more than 20%).

In some duplex precursors of the present invention that are duplex articles (duplex precursors), the one or more UV absorbing agents in both of the first UV filter layer and the second UV filter layer are of the same class of materials and are present in the respective UV filter layers in the same total amount, within ±20%.

Each of the one or more UV absorbing agents has a $\lambda_{max}$ of at least 200 nm and up to and including 390 nm, or at least 300 nm and up to and including 390 nm.

The type of UV absorbing agents useful in the UV filter layers is not particularly limited as long as the characteristics and properties described herein for the resulting precursor are achieved. For example, the compounds can be chosen from the chemical classes of compounds including but not limited to, benzotriazoles (including substituted hydroxyphenylbenzotriazoles), benzophenones, cinnamic acid compounds, triazines (including hydroxyphenyltriazines), stilbenes, benzoxazoles, dibenzoylmethanes, cyanoesters, cyanosulfones, cyanoacrylates, formamindines, and benzoazinones. The benzotriazoles or cyanoacrylates are particularly useful.

The UV absorbing agents useful in the UV filter layers can be immobilized and have the necessary c(log P) value of at least 5 as described above. However, some useful UV absorbing agents are not immobilized and have a c(log P) value that is less than 5 and perhaps as low as 3. The UV absorbing agents can be added to the UV filter layers as dispersions within suitable organic solvents, or they can be added without any solvent.

Each UV filter layer can also include one or more hardeners for the hydrophilic binder or colloid, biocides, surfactants, emulsifiers, and other addenda that would be readily apparent to one skilled in the art, as long as such addenda do not adversely affect the purpose for which the UV filter layers are included in the precursors.

In some embodiments of this invention, the one or more UV absorbing agents in each of the first and second UV filter layers are immobilized UV absorbers as defined above.

Non-Color Hydrophilic Photosensitive Layers:

The silver halide(s) in the essential non-color hydrophilic photosensitive layers comprise silver cations of one or more silver halides that can be converted into silver metal particles (nuclei) according to a desired pattern upon photo exposure of each non-color hydrophilic photosensitive layer in an imagewise fashion. The silver halide latent image obtained by exposure to suitable radiation can then be developed into a silver metal image using known silver development procedures and chemistry (described below). The silver halide (or combination of silver halides) is photosensitive, meaning that radiation from UV to visible light (for example, of at least 200 nm and up to and including 750 nm radiation) is generally used to convert silver cations to into a latent silver halide image. In some embodiments, the silver halide is provided as a thermally-sensitive silver salt (such as silver behenate) and the non-color photosensitive hydrophilic layer can be both photosensitive and thermally sensitive (sensitive to imaging thermal energy such as infrared radiation).

The useful photosensitive silver halides can be, for example, silver chloride, silver bromide, silver chlorobromoiodide, silver bromochloroiodide, silver chlorobromide, silver bromochloride, or silver bromoiodide that are prepared as individual compositions (or emulsions). The various halides can be listed in the silver halide compound name in descending order of halide amount. In addition, individual silver halide emulsions can be prepared and mixed to form a mixture of silver halide emulsions that are used on the same or different supporting sides of the transparent substrate. In general, the useful silver halides comprise up to and including 100 mol % of chloride or up to and including 100 mol % of bromide, and up to and including 5 mol % iodide, all based on total silver. These silver halides are generally known as "high chloride" or "high bromide" silver halides and are used to form "high chloride", or "high bromide" emulsions, respectively. Particularly useful silver halides comprise at least 50 mol % and up to and including 100 mol % bromide and the remainder is either or both of chloride or iodide, based on the total silver.

The silver halide grains used in each non-color hydrophilic photosensitive layer generally have an ESD of at least 30 nm and up to and including 300 nm, or more likely at least 50 nm and up to and including 200 nm.

The coverage of total silver in the silver halide(s) in each non-color hydrophilic photosensitive layer can be at least 3500 mg Ag/m$^2$ and typically at least 3500 mg Ag/m$^2$ but less than 5000 mg Ag/m$^2$, for example up to and including 4900 mg Ag/m$^2$. These amounts of Ag also represent the total amount of Ag on each supporting side of the transparent substrate. Higher amounts for example of up to and including 8,000 mg Ag/m$^2$ on each supporting side of the transparent substrate can be used if desired. These amounts of silver halide are then converted by the processes described below to corresponding amounts of silver metal in each conductive layer on one or both supporting sides of the transparent substrate in the resulting conductive film elements.

The dry thickness of each non-color hydrophilic photosensitive layer is generally at least 0.1 μm and up to and including 10 μm, and typically it is at least 0.1 μm and up to and including 5 μm.

The final dry non-color hydrophilic photosensitive layer can be made up of one or more individually coated non-color hydrophilic photosensitive sub-layers that can be applied using the same or different silver halide emulsion formulations. Each sub-layer can be composed of the same or different silver halide(s), hydrophilic binders or colloids, and addenda. The sub-layers can have the same or different amount of silver.

The photosensitive silver halide(s) used in the first non-color hydrophilic photosensitive layer on one supporting side of the transparent substrate can be the same or different as the photosensitive silver halide(s) used in the opposing second supporting side non-color hydrophilic photosensitive layer.

The photosensitive silver halide grains (and any addenda associated therewith as described below) are dispersed (generally uniformly) in one or more suitable hydrophilic binders or colloids to form a hydrophilic silver halide emulsion. Examples of such hydrophilic binders or colloids include but are not limited to, hydrophilic colloids such as gelatin and gelatin derivatives, polyvinyl alcohol (PVA), poly(vinyl pyrrolidone) (PVP), casein, and mixtures thereof. Suitable hydrophilic colloids and vinyl polymers and copolymers are also described in Section IX of *Research Disclosure* Item 36544, September 1994 that is published by Kenneth Mason Publications, Emsworth, Hants, PO10 7DQ, UK. A particularly useful hydrophilic colloid is gelatin or a gelatin derivative of which several are known in the photographic art.

The amount of hydrophilic binder or colloid in each non-color hydrophilic photosensitive layer can be adapted to the particular dry thickness that is desired as well as the amount of silver halide that is incorporated. It can also be adapted to meet desired dispersibility, swellability, and layer adhesion to the transparent substrate. In general, the one or more hydrophilic binders or colloids are present in an amount of at least 10 weight % and up to and including 95 weight % based on the total solids in the emulsion formulation or dry layer. The dry ratio of hydrophilic binder(s) to silver in each non-color hydrophilic photosensitive layer can vary widely depending upon desired conductivity and integrated transmittance, and can be for example from 1:10 to 10:1.

One useful non-color hydrophilic photosensitive layer composition has a relatively high silver ion/low hydrophilic binder (for example, gelatin) weight ratio. For example, a particularly useful weight ratio of silver ions (and eventually silver metal) to hydrophilic binder or colloid such as gelatin (or its derivative) is at least 0.1:1, or even at least 1.5:1 and up to and including 10:1. A particularly useful weight ratio of silver ions to the hydrophilic binder or colloid can be at least 2:1 and up to and including 5:1. Other weight ratios can be readily adapted for a particular use and dry layer thickness.

In some embodiments, the hydrophilic binder or colloid is used in combination with one or more hardeners designed to harden the particular hydrophilic binder such as gelatin and thereby control layer swellability. Particularly useful hardeners for gelatin and gelatin derivatives include but are not limited to, non-polymeric vinyl-sulfones such as bis(vinyl-sulfonyl) methane (BVSM), bis(vinyl-sulfonyl methyl) ether (BVSME), and 1,2-bis(vinyl-sulfonyl acetamide)ethane (BVSAE). Mixtures of hardeners can be used if desired. The hardeners can be incorporated into each non-color hydrophilic photosensitive layer in any suitable amount that would be readily apparent to one skilled in the art.

In general, each non-color hydrophilic photosensitive layer can have a swell ratio of at least 150% as determined by optical microscopy of element cross-sections and the amount of swell can be controlled generally by the amount of hardener in the layers or in processing solutions. The "swell ratio" refers to the amount of swelling from the original dry thickness that occurs after processing of the layer under typical processing conditions.

In many embodiments, the silver halide in the silver halide emulsion(s) can be sensitized to any suitable wavelength of exposing radiation. Organic visible sensitizing dyes can be used, but it can be advantageous to sensitize the silver halide emulsion to the UV portion of the electromagnetic spectrum (for example from 200 nm to 390 nm) without using visible light sensitizing dyes to avoid unwanted dye stains and to improve integrated transmittance.

Useful addenda that can be included with the silver halides in the silver halide emulsions include chemical and spectral sensitizers, filter dyes, organic solvents, thickeners, dopants, emulsifiers, surfactants, stabilizers, hardeners, and antifoggants such as those materials described in *Research Disclosure* Item 36544, September 1994 and the many publications identified therein. Such materials are well known in the art and it would not be difficult for a skilled artisan to formulate or use for purposes described herein. Some useful silver salt emulsions are described, for example in U.S. Pat. No. 7,351,523 (Grzeskowiak), U.S. Pat. No. 5,589,318, and U.S. Pat. No. 5,512,415 (both to Dale et al.). Other useful silver halide emulsions are described in copending and commonly assigned U.S. Ser. No. 14/166,910 (noted above).

Useful silver halide emulsions containing silver halide grains that can be reduced to silver metal particles can be prepared by any suitable method of grain growth, for example, by using a balanced double run of silver nitrate and salt solutions using a feedback system designed to maintain the silver ion concentration in the growth reactor. Known dopants can be introduced uniformly from start to finish of precipitation or can be structured into regions or bands within the silver halide grains. Useful dopants include but are not limited to, osmium dopants, ruthenium dopants, iron dopants, rhodium dopants, iridium dopants, and cyanoruthenate dopants. A combination of osmium and iridium dopants such as a combination of osmium nitrosyl pentachloride and iridium dopant is useful. Such complexes can be alternatively utilized as grain surface modifiers in the manner described in U.S. Pat. No. 5,385,817 (Bell). Chemical sensitization can be carried out by any of the known silver halide chemical sensitization methods, for example using thiosulfate or another labile sulfur compound, or in combination with gold complexes.

Useful silver halide grains can be cubic, rounded-cubic, octahedral, rounded octahedral, polymorphic, tabular, or thin tabular emulsion grains. Such silver halide grains can be regular untwinned, regular twinned, or irregular twinned with cubic, rounded-cubic, or octahedral faces. In one embodiment, the silver halide grains can be cubic having an ESD of less than 0.5 µm but at least 0.05 µm.

Specific references relating to the preparation of emulsions of differing halide ratios and morphologies are U.S. Pat. No. 3,622,318 (Evans); U.S. Pat. No. 4,269,927 (Atwell); U.S. Pat. No. 4,414,306 (Wey et al.); U.S. Pat. No. 4,400,463 (Maskasky); 4,713,323 (Maskasky); U.S. Pat. No. 4,804,621 (Tufano et al.); U.S. Pat. No. 4,783,398 (Takada et al.); U.S. Pat. No. 4,952,491 (Nishikawa et al.); U.S. Pat. No. 4,983,508 (Ishiguro et al.); U.S. Pat. No. 4,820,624 (Hasebe et al.); U.S. Pat. No. 5,264,337 (Maskasky); U.S. Pat. No. 5,275,930 (Maskasky); U.S. Pat. No. 5,320,938 (House et al.); U.S. Pat. No. 5,550,013 (Chen et al.); U.S. Pat. No. 5,726,005 (Chen et al.); and U.S. Pat. No. 5,736,310 (Chen et al.).

Antifoggants and stabilizers can be added to give the silver halide emulsion the desired sensitivity, if appropriate. Antifoggants that can be used include, for example, azaindenes such as tetraazaindenes, tetrazoles, benzotriazoles, imidazoles and benzimidazoles. Specific antifoggants that can be used include but are not limited to, 4-carboxymethyl-4-thiazoline-2-thione, 4-hydroxy-6-methyl-1,3,3a,7-tetraazaindene, 1-(3-acetamidophenyl)-5-mercaptotetrazole, 6-nitrobenzimidazole, 2-methylbenzimidazole, and benzotriazole, individually or in combination.

The essential silver halide grains and hydrophilic binders or colloids and optional addenda can be formulated and coated as a silver halide emulsion using suitable emulsion solvents including water and water-miscible organic solvents. For example, useful solvents for making the silver halide emulsion or coating formulation include water, an alcohol such as methanol, a ketone such as acetone, an amide such as formamide, a sulfoxide such as dimethyl sulfoxide, an ester such as ethyl acetate, an ether, a liquid poly(vinyl alcohol), or combinations of these solvents. The amount of one or more solvents used to prepare the silver halide emulsions can be at least 30 weight % and up to and including 50 weight % of the total silver halide emulsion formulation weight. Such coating formulations can be prepared using any of the photographic emulsion making procedures that are known in the photographic art.

Hydrophilic Overcoats:

Disposed over each non-color hydrophilic photosensitive layer, on either or both supporting sides of the transparent substrate, is a hydrophilic overcoat. This hydrophilic overcoat can be the outermost layer in the precursor (that is, there are no layers purposely placed over it on either or both supporting sides of the transparent substrate). Thus, generally if both supporting sides of the transparent substrate are used to provide a conductive silver pattern, then a hydrophilic overcoat can be present as the outermost layer on both supporting sides of the transparent substrate. Thus, a first hydrophilic overcoat can be disposed over the first non-color hydrophilic photosensitive layer on the first supporting side of the transparent substrate, and a second hydrophilic overcoat can be disposed over a second non-color second hydrophilic photosensitive layer on the opposing second supporting side of the transparent substrate. In most embodiments, each hydrophilic overcoat can be directly disposed on each non-color hydrophilic photosensitive layer, meaning that there are no intervening layers on the supporting sides of the transparent substrate. The chemical compositions and dry thickness of these hydrophilic overcoats can be the same or different, but in most embodiments they have essentially the same chemical composition and dry thickness on both supporting sides.

Optionally, but in many embodiments, at least the first hydrophilic overcoat, and typically both hydrophilic overcoats on opposing sides, comprises one or more immobilized radiation absorbers [such as immobilized ultraviolet radiation (UV) absorbers] in a total amount of at least 5 mg/m$^2$, or more typically in an amount of at least 5 mg/m$^2$ and up to and including 100 mg/m$^2$, or even at least 10 mg/m$^2$ and up to and including 50 mg/m$^2$. When mixtures of immobilized radiation absorbers [such as immobilized ultraviolet radiation (UV) absorbers] are used, these amounts represent the total amount of all immobilized radiation absorbers in the particular hydrophilic overcoat.

The one or more immobilized ultraviolet radiation absorbers can be selected from one or more of the classes of compounds including but not limited to, benzotriazoles (including substituted hydroxyphenylbenzotriazoles), benzophenones, cinnamic acid compounds, triazines (including hydroxyphenyltriazines), stilbenes, benzoxazoles, dibenzoylmethanes, cyanoesters, cyanosulfones, cyanoacrylates, formamindines, and benzoazinones that are known to absorb ultraviolet radiation and also have the necessary c(log P) value of at least 5 as described above.

The substituted hydroxyphenylbenzotriazoles are particularly useful and can be obtained from a variety of commercial sources. For example, the UV radiation absorbers sold under the TINUVIN® mark are particularly useful. Mixtures of these compounds can be used if desired to provide the desired radiation absorption. For example, the commercial product marketed as TINUVIN® 8515 or Chiguard® 8515DF is a mixture of immobilized ultraviolet absorbing compounds [CAS 25973-55-1 having a c(log P) of 7.25] and [CAS 3896-11-5 having a c(log P) of 5.55] can be used.

Many such immobilized radiation absorbers can be obtained from various commercial sources or they can be prepared using known synthetic methods and starting materials.

While some of the hydrophilic overcoats contain no addenda other than the immobilized ultraviolet radiation absorbers, and perhaps matte particles and surfactants, some embodiments of this invention comprise one or more silver halides in the hydrophilic overcoats in the same or different amount so as to provide silver metal (nuclei), after exposure and processing, in an amount of at least 5 mg Ag/m$^2$ and up to and including 150 mg Ag/m$^2$, or at least 5 mg Ag/m$^2$ and up to and including 75 mg Ag/m$^2$.

This silver halide and the immobilized ultraviolet radiation absorbers can be dispersed (generally uniformly) within one or more hydrophilic binders or colloids in each hydrophilic overcoat, which hydrophilic binders or colloids include those described above for the non-color hydrophilic photosensitive layers. In many embodiments, the same hydrophilic binders or colloids can be used in all of the layers on one or both supporting sides of the transparent substrate. However, different hydrophilic binders or colloids can be used in the various layers and on one or both supporting sides of the transparent substrate. The amount of one or more hydrophilic binders or colloids in each hydrophilic overcoat can be the same or different and generally at least 50 weight % and up to and including 99 weight %, based on total hydrophilic overcoat dry weight.

Each hydrophilic overcoat can also comprise one or more hardeners for a hydrophilic binder or colloid (such as gelatin or a gelatin derivative). Useful hardeners are described above.

When present, the same or different silver halide(s) can be used in each hydrophilic overcoat on opposing supporting sides, and they can be the same as the silver halide(s) in each non-color hydrophilic photosensitive layer over which the hydrophilic overcoat is disposed.

Moreover, such one or more silver halides in each hydrophilic overcoat can have a grain ESD of at least 100 nm and up to and including 1000 nm, or at least 150 nm and up to and including 600 nm.

In some embodiments, such one or more silver halides in each hydrophilic overcoat has a grain ESD that is larger than the grain ESD of the silver halide in the non-color hydrophilic photosensitive layer over which it is disposed.

The dry thickness of the each hydrophilic overcoat can be at least 100 nm and up to and including 800 nm or more particularly at least 300 nm and up to and including 500 nm. In many embodiments, the grain ESD to dry thickness ratio in the hydrophilic overcoat can be from 0.25:1 to and including 1.75:1 or more likely from 0.5:1 to and including 1.25:1.

It is also useful in conductive film element precursors that the silver halide(s) in the each hydrophilic overcoat and the silver halide(s) in each non-color hydrophilic photosensitive layer over which it is disposed are matched in photographic speed. This is best achieved when the exposure sensitivity of the silver halide emulsion(s) in the hydrophilic overcoat is at least 10% and up to and including 200% of the optimum sensitivity of silver halide emulsion in the underlying non-color hydrophilic photosensitive layer used to provide the conductive silver pattern, as expressed in µJ/m$^2$.

Additional Layers:

In addition to the three essential layers and components described above on one or both supporting sides of the transparent substrate, the precursor and conductive film elements of this invention can also include other layers that are not essential but can provide some additional properties or benefits, such as adhesion layers and other layers as are known in the photographic art.

The duplex embodiments of the black-and-white silver halide conductive film element precursors further comprise on the opposing second supporting side of the transparent substrate, a second UV filter layer generally disposed directly on the transparent substrate, a second non-color hydrophilic photosensitive layer generally disposed directly on the second UV filter layer, and a second hydrophilic overcoat generally disposed directly on the second non-color hydrophilic photosensitive layer. The second UV filter layer can be the same as or different from the first UV filter layer on the first supporting side of the transparent substrate.

In many duplex embodiments, the second UV filter layer, second non-color hydrophilic photosensitive layer, and the second hydrophilic overcoat have the same composition as the first UV filter layer, first non-color hydrophilic photosensitive layer, and the first hydrophilic overcoat, respectively.

In some embodiments, the exposure sensitivity of the silver halide emulsion in the first hydrophilic overcoat is at least 10% and up to and including 200% of the optimum sensitivity of the silver halide emulsion in the first non-color hydrophilic photosensitive layer, as expressed as µJ/m$^2$, and the exposure sensitivity of the silver halide emulsion in the second hydrophilic overcoat is at least 10% and up to and including 200% of the optimum sensitivity of the silver halide emulsion in the second non-color hydrophilic photosensitive layer, as expressed as µJ/m$^2$. The optimum sensitivities of the respective sides of the transparent substrate can be the same or different.

Preparing Black-and-White Silver Halide Conductive Film Element Precursors

The various layers are formulated using appropriate components and coating solvents and are applied to one or both supporting sides of a suitable transparent substrate (as described above) using known coating procedures including those commonly used in the photographic industry (for example, bead coating, blade coating, curtain coating, hopper coating). Each layer formulation can be applied to each supporting side of the transparent substrate in single-pass procedures or simultaneous multi-layer coating procedures.

Providing Conductive Film Elements

The precursors of this invention are provided for use in the method of this invention and then imagewise exposed to provide a latent silver halide pattern in each non-color hydrophilic photosensitive layer on the transparent substrate. Imagewise exposure also reduces any silver halide(s) in each hydrophilic overcoat(s) to silver metal particles.

More commonly, photosensitive silver halides in each non-color hydrophilic photosensitive layer can be imagewise exposed to appropriate actinic radiation (UV to visible radiation) from a suitable source that are well known in the art, and then developed (silver ions reduced to silver metal) using known aqueous developing solutions (developers) that are commonly used in black-and-white photography. Such developers reduce the silver cations in the latent silver halide patterns in both the exposed non-color hydrophilic photosensitive layers and the hydrophilic overcoats.

Prebath solutions can also be used to treat the exposed silver salts prior to development. Such solutions can include one or more development inhibitors as described above for the developing solutions, and in the same or different amounts. Effective inhibitors include but are not limited to, benzotriazoles, heterocyclic thiones, and mercaptotetrazoles. The prebath temperature can be in the same range as described for development. Prebath time depends upon concentration and the particular inhibitor, but it can range from at least 10 seconds and up to and including 4 minutes.

Numerous developing solutions are known to form silver metal, for example in the form of an electrically-conductive silver grid or pattern corresponding to the imagewise exposure. One commercial silver halide developer that is useful is Accumax® silver halide developer particularly when silver chlorobromide grains are used.

Developing solutions are generally aqueous solutions including one or more silver halide developing agents, of the same or different type, including but not limited to those described in *Research Disclosure* Item 17643 (December, 1978) Item 18716 (November, 1979), and Item 308119 (December, 1989) such as polyhydroxybenzenes (such as dihydroxybenzene, or in its form as hydroquinone, cathecol, pyrogallol, methylhydroquinone, and chlorohydroquinone), aminophenols such as p-methylaminophenol, p-aminophenol, and p-hydroxyphenyiglycine, p-phenylenediamines, ascorbic acid and its derivatives, reductones, erythrobic acid and its derivatives, 3-pyrazolidones such as 1-phenyl-4,4-dimethyl-3-pyrazolidone, 1-phenyl-3-pyrazolidone, and 1-phenyl-4-methyl-4-hydroxymethyl-3-pyrazolidone, pyrazolone, pyrimidine, dithionite, and hydroxylamines. These developing agents can be used individually or in combinations thereof. One or more developing agents can be present in known amounts.

The developing solutions can also include auxiliary silver developing agents that exhibit super-additive properties with a developing agent. Such auxiliary developing agents can include but are not limited to, Elon and substituted or unsubstituted phenidones, in known amounts.

Useful developing solutions can also include one or more silver complexing agents (or silver ligands) including but not limited to, sulfite, thiocyanate, thiosulfate, thiourea, thiosemicarbazide, tertiary phosphines, thioethers, amines, thiols, aminocarboxylates, triazolium thiolates, pyridines (including bipyridine), imidazoles, and aminophosphonates, in known amounts.

The developing solutions can also comprise one or more substituted or unsubstituted mercaptotetrazoles in suitable amounts for various purposes. Useful mercaptotetrazoles include but are not limited to, alkyl-, aryl-, and heterocyclyl-substituted mercaptotetrazoles. Examples of such compounds include but are not limited to, 1-phenyl-5-mercaptotetrazole (PMT), 1-ethyl-5-mercaptotetrazole, 1-t-butyl-5-mercaptotetrazole, and 1-pridinyl-5-mercaptotetrazoles.

Moreover, the developing solution can also include one or more development inhibitors in suitable amounts. Useful development inhibitors include but are not limited to, substituted and unsubstituted benzotriazole compounds such as 5-methylbenzotriazole, imidazoles, benzimidazole thiones, benzathiazole thiones, benzoxazole thiones, and thiazoline thiones.

Other addenda that can be present in the developing solutions in known amounts include but are not limited to, metal chelating agents, preservatives (such as sulfites), antioxidants, small amounts of water-miscible organic solvents (such as benzyl alcohol and diethylene glycol), nucleators, as well as acids, bases (such as alkali hydroxides), and buffers (such as carbonate, borax, phosphates, and other basic salts) to establish a pH of at least 8 and generally of a pH of at least 9.5, or at least 11 and up to and including 14.

Multiple development steps can be used if desired. For example, a first developing solution can provide initial development and then a second developing solution can be used to provide "solution physical development".

Useful development temperatures can range from at least 15° C. and up to and including 60° C. Useful development times can range from at least 10 seconds and up to and including 10 minutes but more likely up to and including 1 minute. The same time or temperature can be used for individual development steps and can be adapted to develop at least 90 mol % of the exposed silver halide. If a prebath solution is not used, the development time can be extended appropriately. Any exposed silver halide(s) in each hydrophilic overcoat is also developed during the development step(s). Washing or rinsing can be carried out with water after or between any development steps.

After development of the exposed silver cations to silver metal, the undeveloped silver halide (in both hydrophilic overcoat and non-color hydrophilic photosensitive layer) is generally removed by treating the developed silver-containing article with a fixing solution. Fixing solutions are well known in the black-and-white photographic art and contain one or more compounds that complex the silver halide for removal from the layers. Thiosulfate salts are commonly used in fixing solutions. The fixing solution can optionally contain a hardening agent such as alum or chrome-alum. The developed film can be processed in a fixing solution immediately after development, or there can be an intervening stop bath or water wash or both. Fixing can be carried out at any suitable temperature and time such as at least 20° C. for at least 30 seconds.

After fixing, the silver metal-containing article can be washed or rinsed in water that can optionally include surfactants or other materials to reduce water spot formation upon drying. Drying can be accomplished in ambient or by heating, for example, in a convection oven at a temperature above 50° C. but below the glass transition temperature of the transparent substrate.

Fixing then leaves the silver metal (or nuclei) in the pattern in each formerly non-color hydrophilic photosensitive layer, which pattern was originally provided by imagewise exposure and corresponding to the silver halide latent pattern. Fixing also removes any non-developed silver halide in each hydrophilic overcoat.

After fixing and before drying as described above, the article comprising the conductive silver metal pattern can be further washed or rinsed with water or then treated to further enhance the conductivity of the silver metal (or nuclei) in the electrically-conductive silver pattern on each supporting side of the transparent substrate. A variety of ways have been proposed to carry out this "conductivity enhancement" process. For example, U.S. Pat. No. 7,985,527 (Tokunaga) and U.S. Pat. No. 8,012,676 (Yoshiki et al.) describe treatments using hot water baths, water vapor, reducing agents, or halides. The details of such treatments are provided in these patents that are incorporated herein by reference.

It is also possible to enhance conductivity of the silver metal particles by repeated contact with a conductivity enhancing agent, washing, drying, and repeating this cycle of treating, washing, and drying one or more times. Useful conductivity enhancing agents include but are not limited to, sulfites, borane compounds, hydroquinones, p-phenylenediamines, and phosphites. The treatment can be carried out at a temperature of at least 30° C. and up to and including 90° C. for at least 0.25 minute and up to and including 30 minutes.

It can be useful in some embodiments to treat the conductive film element with a hardening bath after fixing and before drying to improve the physical durability of the resulting conductive film element. Such hardening baths can include one or more known hardening agents in appropriate amounts that would be readily apparent to one skilled in the art.

Additional treatments such as with a stabilizing bath can also be carried out before a final drying if desired, at any suitable time and temperature.

The method of this invention can be carried out using a black-and-white silver halide conductive film element precursor comprising on both first and opposing second supporting sides of the transparent substrate, suitable first and second UV filter layers disposed over the transparent substrate, first and second non-color hydrophilic photosensitive layers, and first and second hydrophilic overcoats disposed over the first and second non-color hydrophilic photosensitive layers, respectively, the first and second hydrophilic overcoats being the outermost layers on the respective first supporting and opposing second supporting sides of the transparent substrate.

In such methods, both first and second non-color hydrophilic photosensitive layers are appropriately exposed to provide the same or different (usually different) latent silver halide patterns containing silver halide in the first and second non-color hydrophilic photosensitive layers. These different exposures can be simultaneous or sequential in time through the same or different masking elements.

The silver halides in the latent silver halide patterns in the two opposing layers are then converted to silver metal (nuclei or particles) on both sides during the contacting the exposed conductive film element precursor to the developing solution comprising the silver halide developing agent. Thus, both sides can be developed simultaneously.

Unconverted silver halide can be removed from the first and second non-color hydrophilic photosensitive layers, leaving silver metal in the respective first and second patterns corresponding to the first and second latent silver halide patterns on opposing supporting sides of the transparent substrate.

Optionally and desirably, the silver metal in the electrically-conductive silver patterns on both sides of the element can be further treated as described above to enhance silver metal conductivity.

It is desirable in many embodiments of the method of this invention, that the black-and-white silver halide conductive film element precursor (including the duplex precursors) is used to provide a conductive film element that exhibits an overall b* of less than 0.7, and when the imagewise exposing is carried out at 365 nm, crosstalk from one side of the black-and-white silver halide conductive film element precursor to the opposing side of the black-and-white silver halide conductive film element precursor is reduced to less than 1% of crosstalk, or even less than 0.1%, compared to what would occur upon imagewise exposure at 365 nm of the same black-and-white silver halide conductive film element precursor from which all UV absorbing agents have been omitted from the first UV filter layer and second UV filter layer (when present). It is to be understood that additional features of the conductive film element can contribute to overall b* besides the UV absorbing agents, including for example the composition and integrated transmittance of the transparent substrate, the amount of hydrophilic binder(s) in the various layers on one or both sides of the transparent substrate, and any other addenda in the various layers.

The present invention provides at least the following embodiments and combinations thereof, but other combinations of features are considered to be within the present invention as a skilled artisan would appreciate from the teaching of this disclosure:

1. A black-and-white silver halide conductive film element precursor comprising a transparent substrate comprising a first supporting side and an opposing second supporting side, and having disposed on the first supporting side:
a first UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a first non-color hydrophilic photosensitive layer comprising a silver halide coverage of at least 3,500 mg Ag/m$^2$, and a first hydrophilic overcoat disposed over the first non-color hydrophilic photosensitive layer, which first hydrophilic overcoat is the outermost layer on the first supporting side of the transparent substrate, and the first hydrophilic overcoat comprises a hydrophilic binder or colloid, and the first hydrophilic overcoat optionally comprises: (a) one or more immobilized radiation absorbers in a total amount of at least 5 mg/m$^2$, (b) one or more silver halides in a total amount of at least 5 mg Ag/m$^2$, or both (a) and (b), the black-and-white silver halide conductive film element precursor optionally comprising on the opposing second supporting side:

a second UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm, a second non-color hydrophilic photosensitive layer comprising a silver halide coverage of at least 3,500 mg Ag/m$^2$, and a second hydrophilic overcoat disposed over the second non-color hydrophilic photosensitive layer, which second hydrophilic overcoat is the outermost layer on the opposing second supporting side of the transparent substrate, and the second hydrophilic overcoat comprises a hydrophilic binder or colloid, and the second hydrophilic overcoat optionally comprises: (a) one or more immobilized radiation absorbers in a total amount of at least 5 mg/m$^2$, (b) one or more silver halides in a total amount of at least 5 mg Ag/m$^2$, or both (a) and (b), wherein the total amount of the one or more UV absorbing agents in the first UV filter layer and the second UV filter layer, when present, is no more than 1 mmol/m$^2$.

2. The black-and-white silver halide conductive film element precursor of embodiment 1, wherein the one or more UV absorbing agents are present in the first UV filter layer, and optionally in the second UV filter layer, independently in a total amount of at least 0.1 mmol/m$^2$ and up to and including 0.4 mmol/m$^2$, and the total amount of the one or more UV absorbing agents in the first UV filter layer and the second UV filter layer, when present, is no more than 0.8 mmol/m$^2$.

3. The black-and-white silver halide conductive film element precursor of embodiment 1 or 2, wherein the one or more UV absorbing agents in either or both first and second UV filter layers are benzotriazoles or cyanoacrylates.

4. The black-and-white silver halide conductive film element precursor of any of embodiments 1 to 3, wherein each of the one or more UV absorbing agents in either or both first and second UV filter layers has an absorption $\lambda_{max}$ of at least 300 nm and up to and including 390 nm.

5. The black-and-white silver halide conductive film element precursor of any of embodiments 1 to 4, wherein each of the one or more UV absorbing agents in either or both first and second UV filter layers is an immobilized UV absorbing agent.

6. The black-and-white silver halide conductive film element precursor of any of embodiments 1 to 5, wherein the first non-color hydrophilic photosensitive layer comprises silver halide coverage of at least 3,500 mg Ag/m$^2$ but less than 4,900 mg Ag/m$^2$.

7. The black-and-white silver halide conductive film element precursor of any of embodiments 1 to 6 that is a duplex black-and-white silver halide conductive film element and the amount of one or more UV absorbing agents in the first and second UV filter layers is the same, and the total amount of UV absorbing agents in the first and second UV filter layers is at least 0.1 mmol/m² and up to and including 0.7 mmol/m².

8. The black-and-white silver halide conductive film element precursor of any of embodiments 1 to 7, wherein the first hydrophilic overcoat, and the second hydrophilic overcoat when present, comprises (a) one or more immobilized radiation absorbers in a total amount of at least 5 mg/m².

9. The black-and-white silver halide conductive film element precursor of embodiment 8, wherein the first hydrophilic overcoat, and the second hydrophilic overcoat when present, further comprises (b) one or more silver halides in a total amount of at least 5 mg Ag/m².

10. The black-and-white silver halide conductive film element precursor of any of embodiments 1 to 9, wherein the second UV filter layer is present, and the one or more UV absorbing agents in both of the first and second UV filter layers are of the same class of materials and are present in the respective UV filter layers in the same total amount, within ±20%.

11. The black-and-white silver halide conductive film element precursor of any of embodiments 1 to 10 that is a duplex black-and-white silver halide conductive film element comprising the same order of layers and layer compositions on both the first supporting side and the opposing second supporting side of the transparent substrate.

12. A method for preparing a conductive film element comprising:
providing the black-and-white silver halide conductive element film precursor of any of embodiments 1 to 11,
imagewise exposing the black-and-white silver halide conductive film element precursor to provide a latent silver halide pattern in the first non-color hydrophilic photosensitive layer,
converting the latent silver halide pattern to an electrically-conductive silver metal pattern by contacting the latent silver halide pattern with a developing solution comprising a silver halide developing agent,
removing any unconverted silver halide from the first non-color hydrophilic photosensitive layer, leaving the electrically-conductive silver metal pattern corresponding to the silver halide latent pattern, and
optionally further treating the electrically-conductive silver metal pattern to enhance its conductivity.

13. The method of embodiment 12, wherein when the imagewise exposing is carried out at 365 nm, crosstalk from one side of the black-and-white silver halide conductive film element precursor to the opposing side of the black-and-white silver halide conductive film element precursor is reduced to less than 1% of crosstalk that would occur upon imagewise exposure at 365 nm of a black-and-white silver halide conductive film element precursor constructed in the same manner and composition but from which the all UV absorbing agents have been omitted from the first UV filter layer and from the second UV filter layer when present.

14. A conductive film element obtained by the method of embodiment 12 or 13, the conductive film element comprising:
a transparent substrate that is optionally flexible, and the conductive film element comprises a first supporting side and an opposing second supporting side, and comprises on the first supporting side:
a first UV filter layer comprising a hydrophilic binder or colloid and one or more UV absorbing agents that are present in a total amount of at least 0.01 mmol/m² and up to and including 0.5 mmol/m², each of the one or more UV absorbing agents having a $\lambda_{max}$ of at least 200 nm and up to and including 390 nm, a first non-color hydrophilic layer comprising an electrically-conductive silver metal pattern, and the conductive film element having an integrated transmittance of at least 80% in the conductive silver pattern, and a first hydrophilic overcoat disposed over the first non-color hydrophilic layer, which first hydrophilic overcoat is the outermost layer on the first supporting side of the transparent substrate, and the first hydrophilic overcoat comprises a hydrophilic binder or colloid, and the first hydrophilic overcoat optionally comprises one or more immobilized radiation absorbers in a total amount of at least 5 mg/m², and the conductive film element optionally comprising on the opposing second supporting side:

a second UV filter layer comprising a hydrophilic binder or colloid and one or more UV absorbing agents that are present in a total amount of at least 0.01 mmol/m² and up to and including 0.5 mmol/m², each of the one or more UV absorbing agents having a $\lambda_{max}$ of at least 200 nm and up to and including 390 nm, a second non-color hydrophilic layer comprising an electrically-conductive silver metal pattern, and the conductive film element having an integrated transmittance of at least 80% in the conductive silver pattern, and a second hydrophilic overcoat disposed over the second non-color hydrophilic layer, which first hydrophilic overcoat is the outermost layer on the second supporting side of the transparent substrate, and the second hydrophilic overcoat comprises a hydrophilic binder or colloid, and the second hydrophilic overcoat optionally comprises one or more immobilized radiation absorbers in a total amount of at least 5 mg/m², wherein the total amount of the one or more UV absorbing agents in the first UV filter layer and the second UV filter layer, when present, is no more than 1 mmol/m².

15. The conductive film element of embodiment 14 that is a duplex black-and-white silver halide conductive film element comprising the same order of layers and layer compositions on both the first supporting side and the opposing second supporting side of the transparent substrate.

The following Examples are provided to illustrate the practice of this invention and are not meant to be limiting in any manner.

Duplex black-and-white conductive film element precursors were prepared using 100 μm poly(ethylene terephthalate) transparent substrate and coated silver halide emulsions that were hardened using BVSM [1,1'-(methylene(sulfonyl))bis-ethane] coated at 0.5 weight % of total gelatin.

A first UV filter layer (Layer 1) was provided for UV absorption directly on a first supporting side of the transparent poly(ethylene terephthalate) (PET) substrate. Layer 1 included 1500 mg/m² of gelatin and coated amounts of ultraviolet (UV) absorbing agents as described below in TABLE VII. These UV absorbing agents are commercially available as TINUVIN® 8515 containing an 85/15 weight blend of TINUVIN® 328 UV absorbing dye [CAS 25973-55-1, M.W. 351.5] and TINUVIN® 326 UV absorbing dye [CAS 3896-11-5, M.W. 315.8].

A first non-color hydrophilic photosensitive layer (Layer 2) that included a non-color photosensitive silver halide emulsion (Emulsion 1) was disposed directly over Layer 1. The silver (Ag) to gelatin weight ratio was kept constant at 2.45:1 (or at a volume ratio of about 0.312:1).

The black-and-white silver halide conductive film element precursor further included a first hydrophilic overcoat layer (Layer 3) disposed directly over Layer 2, which Layer 3 included 545 mg/m² of gelatin, 6 mg/m² of 0.6 μm insoluble polymeric matte particles, 30 mg/m² of a non-color silver halide emulsion (Emulsion 2), 10 mg/m² TINUVIN® 8515 ultraviolet (UV) radiation absorber, and conventional coating surfactants. The emulsion had a composition of 100 mol % silver bromide and the emulsion grains had cubic morphology and an edge length 0.36 μm.

Duplicate Layers 1, 2, and 3, were also disposed directly on the opposing second supporting side of the transparent PET substrate, in the same order and composition as the layers on the first supporting side of the PET substrate.

Both sides of the resulting duplex black-and-white silver halide conductive film element precursors were simultaneously and separately exposed through chromed design masks using UV radiation at a wavelength of 365 nm. Each mask featured a grid pattern that provided exposure through lines having a three μm opening onto each conductive film element precursor, with the exposing radiation impacting Layer 3 first on each side.

The exposed duplex black-and-white silver halide conductive film element precursors were processed to reduce the silver cations in the UV exposed regions to silver metal on both supporting sides of the transparent substrate, and to form conductive film elements using the processing sequence shown below in TABLE I. The evaluation results of the resulting duplex conductive film elements comprising conductive silver patterns on both sides are shown below in TABLE VII.

TABLE I

Processing Sequence

| Processing Step/Solution | Processing Temperature (° C.) | Processing Time, (minutes) |
|---|---|---|
| Developing/Developer 1 | 38 | 0.5 |
| Washing/rinsing with water | 40 | 1.0 |
| Developing/Developer 2 | 42 | 3.0 |
| Fixing/Fixing Solution | 40 | 1.77 |
| Washing/rinsing with water | 40 | 1.0 |
| Conductivity Enhancement/Conductivity Enhancement Solution | 50 | 2.0 |
| Washing/rinsing with water | 40 | 1.0 |
| Drying | 60 | 15.0 |
| Conductivity Enhancement/Conductivity Enhancement Solution | 50 | 2.0 |
| Washing/rinsing with water | 40 | 1.0 |
| Drying | 60 | 15.0 |
| Conductivity Enhancement/Conductivity Enhancement Solution | 50 | 2.0 |
| Washing/rinsing with water | 40 | 1.0 |
| Drying | 60 | 15.0 |
| Stabilizing/Stabilizer Solution | 40 | 1.0 |
| Washing/rinsing with water | 40 | 1.0 |

The aqueous processing solutions used in the noted processing sequence of TABLE I are described below in TABLES II through VI, all of which processing solutions were prepared in de-mineralized water. Drying was carried out using a convection oven.

TABLE II

Developer 1

| Component | Amount (g/liter) |
|---|---|
| Potassium Hydroxide (45.5 weight %) | 10.83 |
| Sodium Bromide | 5.00 |
| 4,4-Dimethyl-1-phenyl-3-pyrazolidinone | 0.33 |
| 1-Phenyl-5-mercaptotetrazole | 0.13 |

TABLE II-continued

Developer 1

| Component | Amount (g/liter) |
|---|---|
| 5-methylbenzotriazole | 0.17 |
| Sodium hydroxide (50 weight %) | 1.82 |
| Phosphonic acid, [nitrilotris(methylene)]tris-, pentasodium salt | 0.29 |
| N,N'-1,2-ethanediylbis(N-(carboxymethyl)glycine, | 1.77 |
| Sodium carbonate monohydrate | 8.33 |
| Potassium Sulfite (45 weight %) | 83.33 |
| Hydroquinone | 12.50 |
| 5,5'-[Dithiobis(4,1-phenyleneimino)]bis(5-oxo-pentanoic acid | 0.12 |

TABLE III

Developer 2

| Component | Amount (g/liter) |
|---|---|
| Sodium Sulfite | 92.54 |
| Hydroquinone | 4.63 |
| N,N-bis(2-(bis(carboxymethyl)-amino)ethyl)- glycine, pentasodium salt | 0.950 |
| Sodium tetraborate pentahydrate | 2.830 |
| Sodium thiocyanate | 0.42 |

TABLE IV

Fixing Solution

| Component | Amount (g/liter) |
|---|---|
| Acetic Acid | 24.43 |
| Sodium hydroxide (50 weight %) | 10.25 |
| Ammonium thiosulfate | 246.50 |
| Sodium metabisulfite | 15.88 |
| Sodium tetraborate pentahydrate | 11.18 |
| Aluminum sulfate (18.5 weight %) | 36.26 |

TABLE V

Conductivity Enhancement Solution

| Component | Amount (g/liter) |
|---|---|
| [1,2-Bis(3-aminopropylamino)-ethane] | 11.15 |
| Triethanolamine (99 weight %) | 38.6 |
| Triethanolamine hydrochloride | 14.0 |
| Dimethylaminoborane | 12.0 |
| Sodium lauryl sulfate | 0.030 |
| 2,2-Bipyridine | 1.00 |

TABLE VI

Stabilizer Solution

| Component | Amount (g/liter) |
|---|---|
| Sodium hydroxide (50 weight %) | 0.29 |
| N-[3-(2,5-dihydro-5-thioxo-1H-tetrazol-1-yl)phenyl]acetamide | 0.82 |

Comparative Example 1

A comparative duplex black-and-white silver halide conductive film element precursor was prepared using 300 mg/m² (0.867 mmol/m²) of UV absorbing agent in Layer 1 on each supporting side of the transparent substrate.

Comparative Example 2

Another comparative duplex black-and-white silver halide conductive film element precursor was prepared using 225 mg/m² (0.650 mmol/m²) of UV absorbing agent in Layer 1 on each supporting side of the transparent substrate.

Invention Example 1

A duplex black-and-white silver halide conductive film element precursor prepared according to the present invention as described above in which 100 mg/m² (0.289 mmol/m²) of UV absorbing agent was used in Layer 1 on each supporting side of the transparent substrate.

Invention Example 2

Another duplex black-and-white silver halide conductive film element precursor of the present invention was prepared as described in Invention Example 1 in which 100 mg/m² (0.289 mmol/m²) of UV absorbing agent was used in Layer 1 on each supporting side of the transparent substrate.

The overall yellowness of each resulting "duplex" conductive film element (after imagewise exposure and processing) was measured using a HunterLab UltraScan XE colorimeter and standard CIELAB (L*, a*, b*) color space methods. The measured overall yellowness is reported below in TABLE VII in terms of the 1976 b* coordinates wherein a higher overall b* value indicates increased yellowness (or decreased blueness) and a lower overall b* value indicates decreased yellowness (increased blueness). A further description of the calorimetric test procedure is contained in Billmeyer, F. W., et al., *Principles of Color Technology*, 2<sup>nd</sup> Edition, pp. 62-64, published by John Wiley & Sons, Inc., 1981; or in ASTM Designations: D 2244-05 and D 1729-96. It is to be understood that the shown overall b* values are provided from an evaluation of the entire "duplex conductive film element", and are not solely contributed by the UV absorbing agents in the UV filter layers.

TABLE VII

| Example | Amount of UV Absorbing Agent(s) in Layer 1 on Each Side of Transparent Substrate (mmol/m²) | Overall Conductive Film Element Yellowness (b*) |
| --- | --- | --- |
| Comparative Example 1 | 0.867 | 0.84 |
| Comparative Example 2 | 0.650 | 0.76 |
| Invention Example 1 | 0.289 | 0.60 |
| Invention Example 2 | 0.289 | 0.53 |

These results indicate that the presence of reduced levels of UV absorbing agents in Layer 1 (on both supporting sides of the transparent substrate) of the duplex conductive film elements of the present invention provided a reduction in overall yellowness (b*) after UV exposure and noted processing. This desirable result substantially improved the overall visual appearance of the resulting conductive film elements of the present invention.

At the same time, the presence of the UV absorbing agents, even at lower amounts, provided desirable "crosstalk" protection during exposure of each side of the duplex precursors of this invention.

The invention has been described in detail with particular reference to certain preferred embodiments thereof, but it will be understood that variations and modifications can be effected within the spirit and scope of the invention.

The invention claimed is:

1. A black-and-white silver halide conductive film element precursor comprising a transparent substrate comprising a first supporting side and an opposing second supporting side, and having disposed on the first supporting side:
a first UV filter layer comprising a hydrophilic binder or colloid and one or more UV absorbing agents that are present in a total amount of at least 0.01 mmol/m² and up to and including 0.5 mmol/m², each of the one or more UV absorbing agents having a $\lambda_{max}$ of at least 200 nm and up to and including 390 nm,
a first non-color hydrophilic photosensitive layer comprising a silver halide coverage of at least 3,500 mg Ag/m², and
a first hydrophilic overcoat disposed over the first non-color hydrophilic photosensitive layer, which first hydrophilic overcoat is the outermost layer on the first supporting side of the transparent substrate, and the first hydrophilic overcoat comprises a hydrophilic binder or colloid, and the first hydrophilic overcoat optionally comprises: (a) one or more immobilized radiation absorbers in a total amount of at least 5 mg/m², (b) one or more silver halides in a total amount of at least 5 mg Ag/m², or both (a) and (b), the black-and-white silver halide conductive film element precursor optionally comprising on the opposing second supporting side:
a second UV filter layer comprising a hydrophilic binder or colloid and one or more UV absorbing agents that are present in a total amount of at least 0.01 mmol/m² and up to and including 0.5 mmol/m², each of the one or more UV absorbing agents having a $\lambda_{max}$ of at least 200 nm and up to and including 390 nm,
a second non-color hydrophilic photosensitive layer comprising a silver halide coverage of at least 3,500 mg Ag/m², and
a second hydrophilic overcoat disposed over the second non-color hydrophilic photosensitive layer, which second hydrophilic overcoat is the outermost layer on the opposing second supporting side of the transparent substrate, and the second hydrophilic overcoat comprises a hydrophilic binder or colloid, and the second hydrophilic overcoat optionally comprises: (a) one or more immobilized radiation absorbers in a total amount of at least 5 mg/m², (b) one or more silver halides in a total amount of at least 5 mg Ag/m², or both (a) and (b), wherein the total amount of the one or more UV absorbing agents in the first UV filter layer and the second UV filter layer, when present, is no more than 1 mmol/m².

2. The black-and-white silver halide conductive film element precursor of claim 1, wherein the one or more UV absorbing agents are present in the first UV filter layer, and optionally in the second UV filter layer, independently in a total amount of at least 0.1 mmol/m² and up to and including 0.4 mmol/m², and the total amount of the one or more UV absorbing agents in the first UV filter layer and the second UV filter layer, when present, is no more than 0.8 mmol/m².

3. The black-and-white silver halide conductive film element precursor of claim 1, wherein the one or more UV absorbing agents in either or both first and second UV filter layers are benzotriazoles or cyanoacrylates.

4. The black-and-white silver halide conductive film element precursor of claim 1, wherein each of the one or more UV absorbing agents in either or both first and second UV filter layers has an absorption $\lambda_{max}$ of at least 300 nm and up to and including 390 nm.

5. The black-and-white silver halide conductive film element precursor of claim 1, wherein each of the one or more UV absorbing agents in either or both first and second UV filter layers is an immobilized UV absorbing agent.

6. The black-and-white silver halide conductive film element precursor of claim 1, wherein the first non-color hydrophilic photosensitive layer comprises silver halide coverage of at least 3,500 mg Ag/m$^2$ but less than 4,900 mg Ag/m$^2$.

7. The black-and-white silver halide conductive film element precursor of claim 1 that is a duplex black-and-white silver halide conductive film element and the amount of one or more UV absorbing agents in the first and second UV filter layers is the same, and the total amount of UV absorbing agents in the first and second UV filter layers is at least 0.1 mmol/m$^2$ and up to and including 0.7 mmol/m$^2$.

8. The black-and-white silver halide conductive film element precursor of claim 1, wherein the first hydrophilic overcoat, and the second hydrophilic overcoat when present, comprises (a) one or more immobilized radiation absorbers in a total amount of at least 5 mg/m$^2$.

9. The black-and-white silver halide conductive film element precursor of claim 8, wherein the first hydrophilic overcoat, and the second hydrophilic overcoat when present, further comprises (b) one or more silver halides in a total amount of at least 5 mg Ag/m$^2$.

10. The black-and-white silver halide conductive film element precursor of claim 1, wherein the second UV filter layer is present, and the one or more UV absorbing agents in both of the first and second UV filter layers are of the same class of materials and are present in the respective UV filter layers in the same total amount, within ±20%.

11. The black-and-white silver halide conductive film element precursor of claim 1 that is a duplex black-and-white silver halide conductive film element comprising the same order of layers and layer compositions on both the first supporting side and the opposing second supporting side of the transparent substrate.

12. A method for preparing a conductive film element comprising:
   providing the black-and-white silver halide conductive element film precursor of claim 1,
   imagewise exposing the black-and-white silver halide conductive film element precursor to provide a latent silver halide pattern in the first non-color hydrophilic photosensitive layer,
   converting the latent silver halide pattern to an electrically-conductive silver metal pattern by contacting the latent silver halide pattern with a developing solution comprising a silver halide developing agent,
   removing any unconverted silver halide from the first non-color hydrophilic photosensitive layer, leaving the electrically-conductive silver metal pattern corresponding to the silver halide latent pattern, and
   optionally further treating the electrically-conductive silver metal pattern to enhance its conductivity.

13. The method of claim 12, wherein the black-and-white silver halide conductive film element precursor is a duplex black-and-white silver halide conductive film element precursor.

14. The method of claim 12, wherein when the imagewise exposing is carried out at 365 nm, crosstalk from one side of the black-and-white silver halide conductive film element precursor to the opposing side of the black-and-white silver halide conductive film element precursor is reduced to less than 1% of crosstalk that would occur upon imagewise exposure at 365 nm of a black-and-white silver halide conductive film element precursor constructed in the same manner and composition but from which all UV absorbing agents have been omitted from the first UV filter layer and from the second UV filter layer when present.

15. A conductive film element comprising:
   a transparent substrate that is optionally flexible, and the conductive film element comprises a first supporting side and an opposing second supporting side, and comprises on the first supporting side:
   a first UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a $\lambda_{max}$ of at least 200 nm and up to and including 390 nm,
   a first non-color hydrophilic layer comprising an electrically-conductive silver metal pattern, and the conductive film element having an integrated transmittance of at least 80% in the conductive silver pattern, and
   a first hydrophilic overcoat disposed over the first non-color hydrophilic layer, which first hydrophilic overcoat is the outermost layer on the first supporting side of the transparent substrate, and the first hydrophilic overcoat comprises a hydrophilic binder or colloid, and the first hydrophilic overcoat optionally comprises one or more immobilized radiation absorbers in a total amount of at least 5 mg/m$^2$, and
   the conductive film element optionally comprising on the opposing second supporting side:
   a second UV filter layer comprising a hydrophilic binder or colloid and one or more UV absorbing agents that are present in a total amount of at least 0.01 mmol/m$^2$ and up to and including 0.5 mmol/m$^2$, each of the one or more UV absorbing agents having a$\lambda_{max}$ of at least 200 nm and up to and including 390 nm,
   a second non-color hydrophilic layer comprising an electrically-conductive silver metal pattern, and the conductive film element having an integrated transmittance of at least 80% in the conductive silver pattern, and
   a second hydrophilic overcoat disposed over the second non-color hydrophilic layer, which first hydrophilic overcoat is the outermost layer on the second supporting side of the transparent substrate, and the second hydrophilic overcoat comprises a hydrophilic binder or colloid, and the second hydrophilic overcoat optionally comprises one or more immobilized radiation absorbers in a total amount of at least 5 mg/m$^2$,
   wherein the total amount of the one or more UV absorbing agents in the first UV filter layer and the second UV filter layer, when present, is no more than 1 mmol/m$^2$.

16. The conductive film element of claim 15, wherein the second UV filter layer is present, and the one or more UV absorbing agents in both of the first and second UV filter layers are of the same class of materials and are present in the respective UV filter layers in the same total amount, within +20%.

17. The conductive film element of claim 15 that is a duplex black-and-white silver halide conductive film element comprising the same order of layers and layer compositions on both the first supporting side and the opposing second supporting side of the transparent substrate.

18. The conductive film element of claim 15, wherein the one or more UV absorbing agents are present in the first UV filter layer, and optionally in the second UV filter layer, independently in a total amount of at least 0.1 mmol/m$^2$ and up to and including 0.4 mmol/m$^2$, and the total amount of the one or more UV absorbing agents in the first UV filter layer and the second UV filter layer, when present, is no more than 0.8 mmol/m$^2$.

19. The conductive film element of claim 15 that is a duplex black-and-white silver halide conductive film element and the amount of one or more UV absorbing agents in the first and second UV filter layers is the same, and the total amount of UV absorbing agents in the first and second UV filter layers is at least 0.1 mmol/m$^2$ and up to and including 0.7 mmol/m$^2$.

* * * * *